(12) United States Patent
Yasumatsu

(10) Patent No.: US 7,781,775 B2
(45) Date of Patent: Aug. 24, 2010

(54) PRODUCTION METHOD OF SEMICONDUCTOR DEVICE AND SEMICONDUCTOR DEVICE

(75) Inventor: Takuto Yasumatsu, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 265 days.

(21) Appl. No.: 12/084,698

(22) PCT Filed: Sep. 6, 2006

(86) PCT No.: PCT/JP2006/317633

§ 371 (c)(1),
(2), (4) Date: May 8, 2008

(87) PCT Pub. No.: WO2007/086163

PCT Pub. Date: Aug. 2, 2007

(65) Prior Publication Data

US 2009/0283773 A1    Nov. 19, 2009

(30) Foreign Application Priority Data

Jan. 25, 2006    (JP) ............................. 2006-016782

(51) Int. Cl.
*H01L 29/786* (2006.01)
*H01L 29/04* (2006.01)
*H01L 21/336* (2006.01)

(52) U.S. Cl. .................. 257/72; 438/157; 438/162; 257/E21.094; 257/E21.104; 257/E21.411; 257/E29.273

(58) Field of Classification Search .......... 257/E21.094, 257/E21.104, E21.121, E21.372, E21.411–E21.416; 438/48, 149

See application file for complete search history.

(56) References Cited

U.S. PATENT DOCUMENTS 5,834,797 A    11/1998    Yamanaka
5,897,346 A *  4/1999    Yamaguchi et al. ......... 438/162

(Continued)

FOREIGN PATENT DOCUMENTS

JP    03-185736    8/1991

(Continued)

OTHER PUBLICATIONS

International Search Report for PCT/JP2006/317633 dated Dec. 12, 2006.

(Continued)

*Primary Examiner*—Fernando L Toledo
*Assistant Examiner*—Mamadou Diallo
(74) *Attorney, Agent, or Firm*—Nixon & Vanderhye, P.C.

(57) ABSTRACT

To provide a method for producing a high-performance semiconductor device by a simple and low-temperature process. The method for producing a semiconductor device, in accordance with the present invention, is a production method of a semiconductor device including a first insulating film, a semiconductor layer, and a second insulating film in this order on a substrate, the method including the steps of: forming a first insulating film including a hydrogen barrier layer; forming a semiconductor layer on a region where the hydrogen barrier layer of the first insulating film is formed; injecting hydrogen into the semiconductor layer; forming a second insulating film, the second insulating film including a hydrogen barrier layer on at least a region where the semiconductor layer is formed; and subjecting the semiconductor layer to hydrogenation annealing.

26 Claims, 5 Drawing Sheets

U.S. PATENT DOCUMENTS

| | | | |
|---|---|---|---|
| 5,923,963 A | 7/1999 | Yamanaka | |
| 6,146,927 A | 11/2000 | Yamanaka | |
| 7,605,401 B2 * | 10/2009 | Yamazaki et al. | 257/72 |
| 2004/0007748 A1 * | 1/2004 | Sakama et al. | 257/410 |
| 2004/0178429 A1 | 9/2004 | Tanaka | |
| 2004/0262606 A1 | 12/2004 | Teramoto | |

FOREIGN PATENT DOCUMENTS

| | | |
|---|---|---|
| JP | 05-275701 | 10/1993 |
| JP | 06-077484 | 3/1994 |
| JP | 09-148582 | 6/1997 |
| JP | 11-163353 | 6/1999 |
| JP | 2001-093853 | 4/2001 |
| JP | 2002-208707 | 7/2002 |
| JP | 2004-111618 | 4/2004 |
| JP | 2004-281506 | 10/2004 |
| JP | 2005-093700 | 4/2005 |
| JP | 2005-203542 | 7/2005 |

OTHER PUBLICATIONS

Chinese Office Action with English translation mailed Apr. 13, 2004 in corresponding Chinese Office Action 200680049220.7.

* cited by examiner (a)

(b)

(c)

(d)

(e)

Fig.1-2
(f)
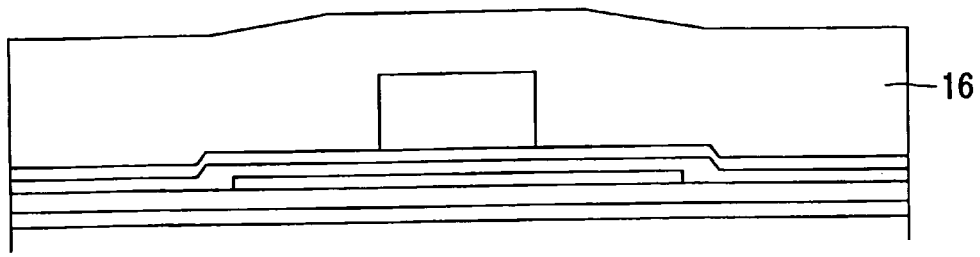
(g)
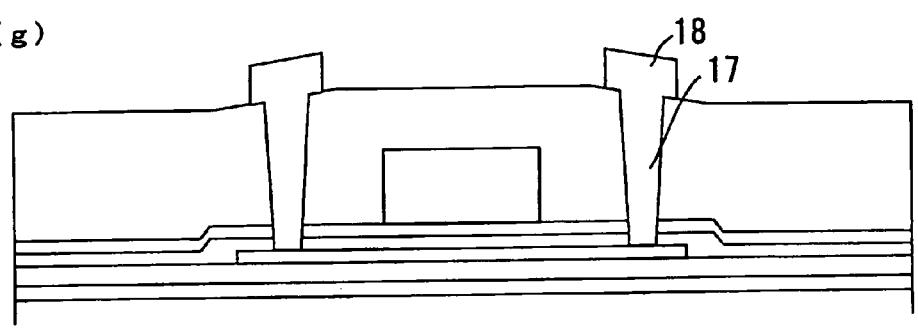
Fig.2
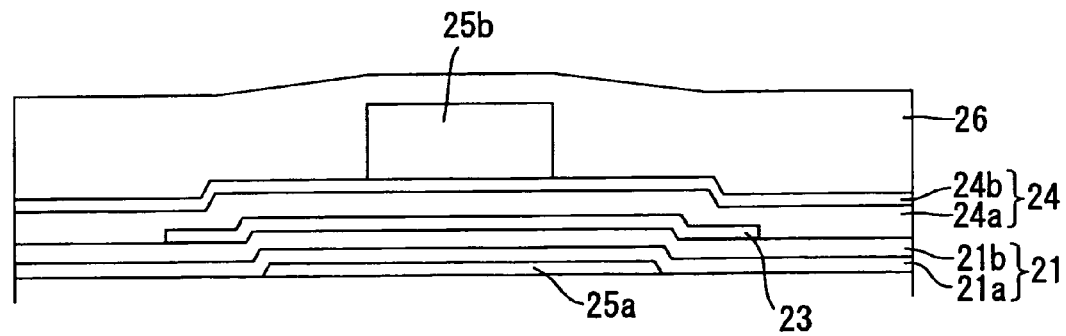
Fig.3
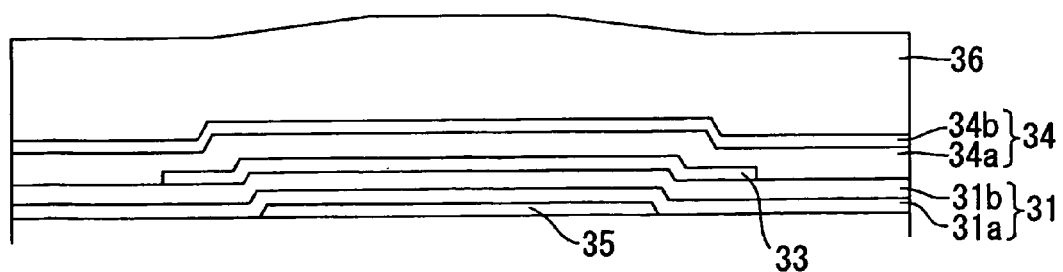

Fig.4-1
(a)
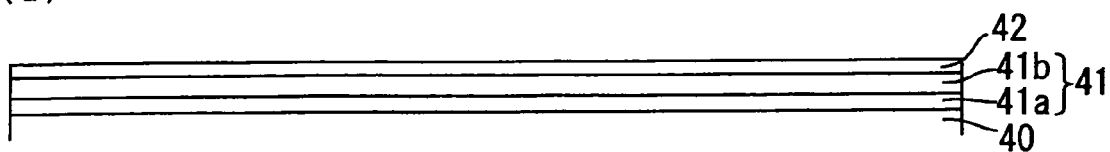
(b)
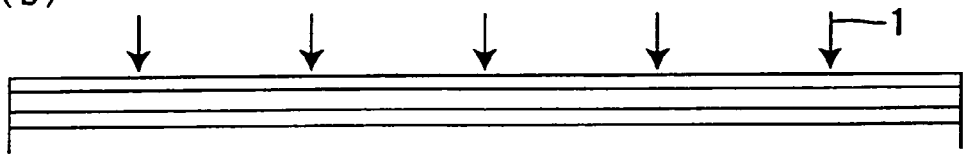
(c)
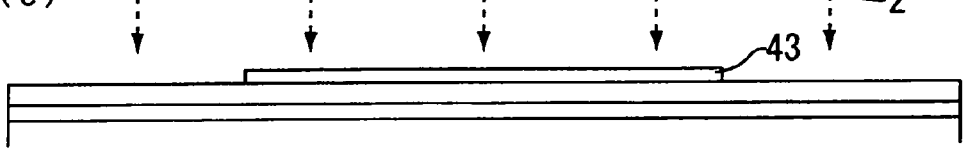
(d)
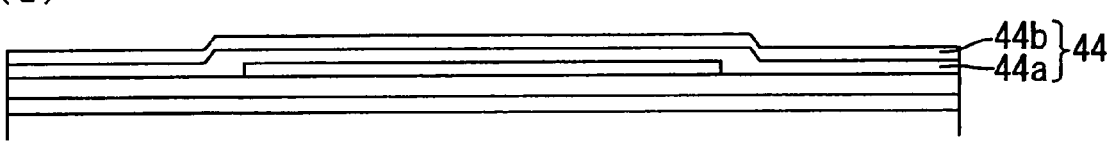
(e)
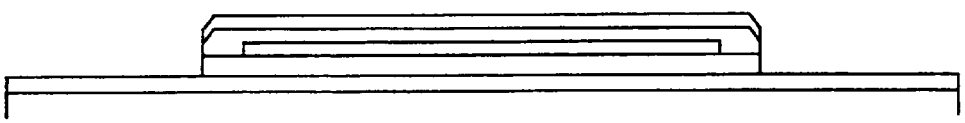

PRODUCTION METHOD OF SEMICONDUCTOR DEVICE AND SEMICONDUCTOR DEVICE

This application is the U.S. national phase of International Application No. PCT/JP2006/317633 filed 6 Sep. 2006 which designated the U.S. and claims priority to Japanese Application No. 2006-016782 filed 25 Jan. 2006, the entire contents of each of which are hereby incorporated by reference.

TECHNICAL FIELD

The present invention relates to a production method of a semiconductor device, and a semiconductor device. More specifically, the present invention relates to a production method of a semiconductor device, preferably used for producing a thin film transistor with high mobility, and the like. The present invention also relates to a semiconductor device and a display device, produced by such a production method.

BACKGROUND ART

A semiconductor device is an active element-including electronic device using electrical characteristics of a semiconductor. Such a semiconductor device has been widely used in an audio device, a communication device, a computer, an electric appliance and the like. Among these, a thin film transistor (hereinafter, also referred to as a "TFT") has been commonly used as a switching element or a driver circuit which controls driving of a pixel, in an active matrix driving liquid crystal display device. Recently, an increase in size and an improvement in definition of the liquid crystal display device have rapidly proceeded. Therefore, an improvement in performances of the TFT has been strongly needed. Also, a reduction in production costs of the TFT has been desired.

With respect to the configuration of the TFT, a structure in which a base insulating film, a silicon layer, a gate insulating film, and a gate electrode are stacked on a glass substrate and to the silicon layer, a source electrode and a drain electrode are connected, has been known. Further, a TFT including a silicon nitride film as the base insulating film and the gate insulating film has been known (for example, refer to Patent Documents 1 and 2). Recently, in an active matrix driving liquid crystal display device, polysilicon (polycrystalline silicon) has been used as a material for the polysilicon layer, which is preferably used for improving the performances of the TFT. The polysilicon film is more excellent in mobility in comparison to amorphous silicon, and it can be formed as a film by a low-temperature process. According to the low-temperature process, distortion of the glass substrate, caused by a high temperature, can be suppressed. Therefore, a TFT having a fine structure can be produced on the substrate as designed, which is advantageous for an improvement in performances of the TFT. In addition, for sufficient exhibition of the mobility of the polysilicon film, a process of deactivating a grain boundary and a crystal defect by a hydrogenation treatment is needed.

For this need, a technology of forming a hydrogen-containing film on at least one surface of a polysilicon film, and liberating the hydrogen in the hydrogen-containing film, thereby diffusing it into the polysilicon film (for example, refer to Patent Document 3). However, if a TFT is produced by this technology, the liberation of the hydrogen in the hydrogen-containing film needs to be performed at a sufficiently high temperature. Therefore, it becomes difficult to produce the TFT by a low-temperature process. In such a point, this technology has room for improvement.

In addition, an interlayer insulating film is commonly formed on a TFT in order to flatten a substrate surface or protect the TFT. As a method of forming the interlayer insulating film, not only a plasma chemical vapor deposition (CVD) method but also a liquid phase method using a liquid material containing polysilazane is disclosed (for example, refer to Patent Documents 4 and 5).

[Patent Document 1]
Japanese Kokai Publication No. Hei-05-275701
[Patent Document 2]
Japanese Kokai Publication No. Hei-11-163353
[Patent Document 3]
Japanese Kokai Publication No. 2001-93853
[Patent Document 4]
Japanese Kokai Publication No. 2005-203542
[Patent Document 5]
Japanese Kokai Publication No. 2005-93700

DISCLOSURE OF INVENTION

The present invention has been made in view of the above-mentioned state of the art. The present invention has an object to provide a production method of a semiconductor device, capable of producing a high-performance semiconductor device by a simple and low-temperature process. Further, the present invention also has an object to provide a semiconductor device and a display device, obtainable by such a production method.

The present inventor made various investigations on a method for producing a high-performance semiconductor device with high performances by hydrogenating the polysilicon layer by a low-temperature process, and the inventor noted insulating films formed on both sides of the polysilicon film. Then, the inventor found the following. In the case where an insulating film including a hydrogen barrier layer is formed as these insulating films to suppress diffusion of the hydrogen from the periphery of the polysilicon layer, and then the polysilicon layer is hydrogenated, a crystal boundary and a crystal defect of the polysilicon layer can be sufficiently deactivated even if the polysilicon layer is subjected to hydrogenation annealing at a low temperature for a short time, and as a result, the polysilicon layer obtains high mobility. Thus, the above-mentioned problems have been admirably solved, leading to completion of the present invention.

That is, the present invention is a production method of a semiconductor device including a first insulating film, a semiconductor layer, and a second insulating film in this order on a substrate, the method including the steps of: forming a first insulating film including a hydrogen barrier layer; forming a semiconductor layer on a region where the hydrogen barrier layer of the first insulating film is formed; injecting hydrogen into the semiconductor layer; forming a second insulating film, the second insulating film including a hydrogen barrier layer on at least a region where the semiconductor layer is formed; and subjecting the semiconductor layer to hydrogenation annealing.

The present invention is mentioned below in more detail.

The production method of the semiconductor device according to the present invention includes the first insulating film-forming step, the semiconductor layer-forming step, the hydrogen-injecting step, the second insulating film-forming step, and the hydrogenation annealing step. The production method of the semiconductor device according to the present invention is not especially limited as long as these steps are included. The production method may include other steps.

The above-mentioned first insulating film-forming step is a step of forming the first insulating film including a hydrogen barrier layer. The configuration of the first insulating film is not especially limited as long as the first insulating film includes a hydrogen barrier layer. A single layer may constitute the first insulating film, or a plurality of layers may be stacked to constitute the first insulating film. Only part of the first insulating film may include the hydrogen barrier layer or the entire first insulating film may include the hydrogen barrier layer. It is preferable that the entire first insulating film includes the hydrogen barrier layer in view of simplification of the first insulating film-formation step. The hydrogen barrier layer of the first insulating film is not especially limited as long as it has a low hydrogen permeability. A metal film including Ta, Ti, Mo, W, or an alloy thereof, a silicon nitride film, and the like may be mentioned. Among these, a silicon nitride film is preferable. Silicon nitride ($SiN_x$) is not especially limited, and trisilicon tetranitride ($Si_3N_4$) and the like is particularly preferably used. Silicon oxynitride (SiNO) also can be preferably used as an alternative for $SiN_x$ because it has a low hydrogen permeability. It is preferable that the hydrogen barrier layer of the first insulating film and the semiconductor layer are formed to have a distance of less than 200 nm therebetween. If the distance between two is 200 nm or more, the hydrogen can not be enclosed around the periphery of the semiconductor layer, and therefore the hydrogenation treatment might not be sufficiently performed at a low temperature. The upper limit of the distance between two is more preferably 100 nm, and still more preferably 50 nm. A chemical vapor deposition (CVD) method and the like is preferable as a method of forming the first insulating film.

The above-mentioned semiconductor layer-forming step is a step of forming a semiconductor layer on a region where the hydrogen barrier layer of the first insulating film is formed. A silicon layer is preferable as the semiconductor layer in view of a reduction in costs and mass production. Among these, a low-temperature polysilicon (polycrystalline silicon) layer, and a continuous grain silicon (CGS) layer are particularly preferable in order to increase the mobility by the hydrogenation treatment. The method of forming the semiconductor layer is not especially limited. For example, the following method may be mentioned: an amorphous silicon film is formed by a CVD method and the like, and then the amorphous silicon film is melted and recrystallized by a laser annealing method, thereby forming a polysilicon film, and the obtained polysilicon film (semiconductor film) is patterned by a photolithography method.

In the present invention, it is sufficient that at least part of the semiconductor layer is formed on the region where the hydrogen barrier layer of the first insulating film is formed. However, it is preferable that the entire semiconductor layer is formed on the region where the hydrogen barrier layer of the first insulating film is formed.

The above-mentioned hydrogen-injecting step is a step of injecting hydrogen into the semiconductor layer. After the semiconductor film is formed in the above-mentioned semiconductor layer-forming step, generally, patterning by a photolithography method and the like (completion of the semiconductor layer), injection of impurity, cleaning before formation of the second insulating film, and the like, are successively performed. The above-mentioned hydrogen-injecting step may be performed in any stages as long as it is performed after formation of the semiconductor film and before formation of the second insulating film, or during formation of the second insulating film. In the present invention, a series of the following processes may be continuously performed in the same chamber. A $SiO_2$ film of the second insulating film is formed by a CVD method; the hydrogen-injecting step is performed; and a $SiN_x$ film that is a hydrogen-containing layer of the second insulating film is formed. The method of injecting hydrogen is not especially limited. A hydrogen exposure treatment in which the semiconductor layer is subjected to hydrogen gas atmosphere, hydrogen plasma treatment in which it is subjected to hydrogen plasma atmosphere and the like are preferably used.

The above-mentioned second insulating film-forming step is a step of forming a second insulating film, the second insulating film including a hydrogen barrier layer on at least a region where the semiconductor layer is formed. The configuration of the second insulating film is not especially limited as long as the hydrogen barrier layer is included. A single layer may constitute the second insulating film or a plurality of layers may be stacked to constitute the second insulating film. Only part of the second insulating film may include the hydrogen barrier layer or the entire second insulating film may include the hydrogen barrier layer as long as the second insulating film includes the hydrogen barrier layer on the region where the semiconductor layer is formed. It is preferable that the entire second insulating film includes the hydrogen barrier layer in view of simplification of the second insulating film-forming step. The hydrogen barrier layer of the second insulating film is not especially limited as long as it has a low hydrogen permeability. A silicon nitride film is preferable. Further, it is preferable that the hydrogen barrier layer of the second insulating film also serves as a moisture barrier layer. If the second insulating film includes the moisture barrier layer, it is possible to prevent moisture from entering from layers on an upper side of the second insulating film, such as an interlayer insulating film. As a result, a reduction in reliability of the semiconductor device can be prevented. The moisture barrier layer is not especially limited as long as it has a low moisture permeability. A silicon nitride layer and the like may be mentioned as the moisture barrier layer, for example. It is preferable that the hydrogen barrier layer of the second insulating film and the semiconductor layer are formed to have a distance of less than 200 nm therebetween. If the distance between the hydrogen barrier layer of the second insulating film and the semiconductor layer is 200 nm or more, hydrogen can not be enclosed around the periphery of the semiconductor layer. Therefore, it might be impossible to perform a sufficient hydrogenation treatment at a low temperature. The upper limit of the distance between two is more preferably 100 nm, and still more preferably 50 nm. A CVD method and the like is preferable as a method of forming the second insulating film.

The above-mentioned hydrogenation annealing step is a step of subjecting the semiconductor layer to hydrogenation annealing. The hydrogenation annealing step may be performed not only for the hydrogenation annealing of the semiconductor layer. The method of the hydrogenation annealing is not especially limited. Heating in a furnace in high-temperature atmosphere, a RTA (Rapid Thermal Annealing) method, and the like may be mentioned. It is preferable that the hydrogenation annealing for the semiconductor layer is performed at 400° C. or less. In the present invention, the hydrogenation annealing is performed using the hydrogen enclosed between the hydrogen barrier layers, and therefore the controllability of the hydrogen amount is excellent in comparison to a method of releasing hydrogen from the hydrogen-containing layer. Further, the hydrogenation annealing can be performed at a low temperature. If the hydrogenation annealing is performed at 400° C. or less, the distortion of the glass substrate can be suppressed, which is advantageous for finely forming the semiconductor device.

Metals which are cheap and have a low melting point such as Al and an Al alloy may be used as the gate electrode. The upper limit of the temperature where the semiconductor layer is subjected to the hydrogenation annealing is more preferably 350° C. and the lower limit thereof is preferably 150° C.

The semiconductor device produced according to the present invention is not especially limited as long as it includes the first insulating film, the semiconductor layer, and the second insulating film on the substrate in this order. For example, an embodiment in which the semiconductor device includes a gate electrode on an upper side of the second insulating film (hereinafter, also referred to as a top-gate structure), an embodiment in which the semiconductor device includes a gate electrode on a lower side of the first insulating film (hereinafter, also referred to as a bottom-gate structure), an embodiment in which the semiconductor device includes a gate electrode on a lower side of the first insulating film and a gate electrode on an upper side of the second insulating film (hereinafter, also referred to as a dual-gate structure) are preferably adopted. It is preferable that the production method of the semiconductor device according to the present invention is performed by a low-temperature process at 400° C. or less. In this case, a material which is inexpensive and has a thermal deformation temperature of 400° C. or less may be used as a material for the gate electrode and the substrate. Accordingly, it is preferable that the gate electrode has a thermal deformation temperature of 400° C. or less in view of a reduction in costs. For example, Al (melting point: 660.37° C.) and an Al alloy may be mentioned. The upper limit of the thermal deformation temperature of the gate electrode is more preferably 350° C. A substrate with an insulating property (insulating substrate) is preferable as the above-mentioned substrate. For example, a glass substrate, a plastic substrate may be mentioned. Among these, it is preferable that the substrate has a thermal deformation temperature of 400° C. or less in view of a reduction in costs. For example, a plastic substrate is preferably used. The upper limit of the thermal deformation temperature of the substrate is more preferably 350° C. According to the present invention, the production steps of the semiconductor device such as the hydrogenation annealing step can be performed by a low-temperature process at 400° C. or less. Accordingly, a gate electrode or a substrate, having a thermal deformation temperature of 400° C. or less, can be used. In such a case, the production method of the present invention is particularly preferable. In the present description, the thermal deformation temperature means a temperature at which a substance starts to be softened and deformed by heating. It is generally a temperature lower than a melting point.

In the present invention, preferable embodiments of the above-mentioned semiconductor layer include an embodiment in which the semiconductor layer is surrounded by the hydrogen barrier layers. If the upper and lower surfaces and the side surfaces of the semiconductor layer are surrounded by the hydrogen barrier layers, hydrogen is enclosed inside the region surrounded by the hydrogen barrier layers. Therefore, effects attributed to the hydrogenation treatment for the semiconductor layer can be significantly improved. As the hydrogen barrier layers surrounding the semiconductor layer, another hydrogen barrier layer may be used in addition to the hydrogen barrier layers in the first and second insulating films. For example, according to the embodiment in which the gate electrode and the interlayer insulating film are formed on the second insulating film in this order, a hydrogen barrier layer formed in the interlayer insulating film may be used.

In the present invention, it is preferable that a silicon nitride film is formed on an upper side of the semiconductor layer, a silicon nitride film is also formed on a lower side of the semiconductor layer, and each of the silicon nitride films formed on an upper side and a lower side of the semiconductor layer has a thickness of 20 nm or more on a region other than a region where an electrode is formed. If each of the silicon nitride films formed on an upper side and a lower side of the semiconductor layer has a thickness of less than 20 nm on a region other than the region where an electrode is formed, the hydrogen barrier effect is significantly reduced. Therefore, the hydrogenation annealing for the semiconductor layer might not be sufficiently performed at a low temperature for a short time. However, the electrode can function as a hydrogen barrier layer instead of the silicon nitride film. Therefore, the silicon nitride film on which the electrode is formed may have a thickness of less than 20 nm.

As the embodiment in which the silicon nitride film with a thickness of 20 nm or more is formed on an upper side and a lower side of the semiconductor layer, an embodiment in which each of the silicon nitride films of the first and second insulating films has a thickness of 20 nm or more may be mentioned. In addition, for example, if an island-shaped gate electrode and an interlayer insulating film are formed on the second insulating film in this order, an embodiment in which the silicon nitride film of the first insulating film has a thickness of 20 nm or more, and the silicon nitride film of the second insulating film and the silicon nitride film of the interlayer insulating film totally have a thickness of 20 nm or more may be mentioned.

In the hydrogenation annealing step, the thickness of the silicon nitride film might be decreased by etching for patterning the gate electrode, and the like. Therefore, the initial thickness of the silicon nitride film needs to be determined, taking into consideration that the thickness of the film might be reduced after formation. For example, if a gate insulating film-including a silicon nitride film and a silicon oxide film is formed, the thickness of the silicon nitride film below the gate electrode is not reduced by the etching for patterning the gate electrode. However, the thickness of the silicon nitride film other than that below the gate electrode is reduced. If such a reduction in thickness in the following steps occurs, the silicon nitride film is formed to have a larger thickness, or the silicon nitride film is formed on the gate electrode, thereby adjusting the total thickness of the silicon nitride film at the time of the hydrogenation annealing step to 20 nm or more.

The semiconductor device produced by the present invention further includes an interlayer insulating film on the second insulating film in order to flatten the substrate surface and protect the second insulating film and the like, generally. If the gate electrode is formed on the second insulating film, it is preferable that the interlayer insulating film covers the gate electrode. The method of forming the interlayer insulating film is not especially limited. A plasma CVD method, a liquid phase method and the like may be mentioned. In the present invention, if the hydrogen barrier layer of the second insulating film also serves as a moisture barrier layer such as a silicon nitride layer, a method of forming the interlayer insulating film using a liquid phase method is preferably used. That is, it is preferable that the semiconductor device further includes an interlayer insulating film on the second insulating film, and the production method includes a step of forming the interlayer insulating film using a liquid material. As a result, the production process and the production device can be simplified, and raw material costs can be reduced. Therefore, production costs can be reduced. The liquid material means a liquid substance such as a solution or a material prepared by dispersing a solid component into a liquid component.

The present invention is also a semiconductor device produced by the production method (hereinafter, also referred to as a "first semiconductor device"). According to the first semiconductor device of the present invention, the hydrogen barrier layer is formed on both sides of the semiconductor layer. Therefore, even by a low-temperature process, the hydrogenation treatment can be effectively performed to produce the first semiconductor device. Therefore, the first semiconductor device can improve the performances.

The present invention is a semiconductor device including a first insulating film, a semiconductor layer, and a second insulating film in this order on a substrate, wherein each of the first and second insulating films includes a hydrogen barrier layer on at least a region where the semiconductor layer is formed, the hydrogen barrier layer of the first insulating film and the semiconductor layer are formed to have a distance of 200 nm therebetween, and the hydrogen barrier layer of the second insulating film and the semiconductor layer are formed to have a distance of 200 nm therebetween (hereinafter, also referred to as a "second semiconductor device"). Such a second semiconductor device of the present invention can be produced by a low-temperature process and can improve the performances, because it has a structure in which each hydrogen barrier layer and the semiconductor layer are formed to have a distance of less than 200 nm and the hydrogenation treatment can be performed under the state where hydrogen is enclosed around the periphery of the semiconductor layer. The upper limit of the distance between the hydrogen barrier layer and the semiconductor layer is 100 nm and still more preferably 50 nm.

The present invention is a semiconductor device including a first insulating film, a semiconductor layer, and a second insulating film in this order on a substrate, wherein each of the first and second insulating films includes a hydrogen barrier layer, and the semiconductor layer is surrounded by the hydrogen barrier layers (also, referred to as a "third semiconductor device"). According to such a third semiconductor device of the present invention, the semiconductor layer is surrounded by the hydrogen barrier layers. Therefore, the hydrogenation treatment can be performed under the state where the hydrogen is enclosed around the periphery of the semiconductor layer. Accordingly, the third semiconductor device of the present invention can be produced at a low temperature for a short time and it can improve the performances. As the hydrogen barrier layers surrounding the semiconductor layer, another hydrogen barrier layer may be used in addition to the hydrogen barrier layers of the first and second insulating films. For example, according to the embodiment in which the gate electrode and the interlayer insulating film are formed on the second insulating film in this order, a hydrogen barrier layer of the interlayer insulating film may be used.

In addition, in accordance with a more preferable embodiment of the present invention, the second semiconductor device and the third semiconductor device are combined.

As preferable embodiments of the above-mentioned second or third semiconductor device, those mentioned in the first semiconductor device may be mentioned. The preferable embodiments of the above-mentioned second or third semiconductor device are mentioned below. Its details are omitted because they are the same as mentioned in the production method of the semiconductor device according to the present invention.

The following embodiments are preferably used as an embodiment of the above-mentioned second or third semiconductor device. An embodiment in which a gate electrode is formed on an upper side of the second insulating film, an embodiment in which a gate electrode is formed on a lower side of the first insulating film, and an embodiment in which a gate electrode is formed on a lower side of the first insulating film and a gate electrode is also formed on a upper side of the second insulating film. In the above-mentioned second or third semiconductor device, it is preferable that the substrate has a thermal deformation temperature of 400° C. or less. It is preferable that the gate electrode has a thermal deformation temperature of 400° C. or less. It is preferable that the hydrogen barrier layer of the first insulating film and the hydrogen barrier layer of the second insulating film are silicon nitride films. It is preferable that a silicon nitride film is formed on an upper side of the semiconductor layer, a silicon nitride film is also formed on a lower side of the semiconductor layer, and each of the silicon nitride films formed on an upper and a lower side of the semiconductor layer has a thickness of 20 nm or more on a region other than a region where an electrode is formed. It is preferable that the hydrogen barrier layer of the second insulating film also serves as a moisture barrier layer. Further, it is preferable that the second or third semiconductor device further includes an interlayer insulating film formed using a liquid material on the second insulating film.

The present invention is also a display device including the above-mentioned semiconductor device. According to the display device of the present invention, performances of the display device can be improved. A liquid crystal display device, an organic electroluminescent display device, and the like are mentioned as the display device of the present invention. Such a display device is preferably used as a system-on-glass display device in which a TFT in a pixel circuit and a TFT in a peripheral circuit are formed on the same substrate.

EFFECT OF THE INVENTION

According to the production method of the semiconductor device of the present invention, the insulating films formed on both sides of the semiconductor layer are each provided with the hydrogen barrier layer, thereby suppressing diffusion of the hydrogen from the periphery of the semiconductor layer. Then, the semiconductor layer is hydrogenated. Therefore, the semiconductor layer can be hydrogenated at a low temperature for a short time, and by a simple process. As a result, a high-performance semiconductor device with a high mobility can be produced.

BEST MODES FOR CARRYING OUT THE INVENTION

The present invention is mentioned in more detail below with reference to Embodiments, but not limited to only these Embodiments.

Embodiment 1

FIGS. 1-1(*a*) to 1-1(*e*) and 1-2(*f*) to 1-2(*g*) are cross-sectional views schematically production steps of a semiconductor device (TFT) in Embodiment 1.

According to the present Embodiment, as shown in FIG. 1-1(*a*), a silicon nitride ($SiN_x$) film 11a with a thickness of 50 nm, a silicon oxide ($SiO_2$) film 11b with a thickness of 100 nm, and an amorphous silicon (a-Si) film 12 with a thickness of 50 nm are successively formed. As a method of forming the $SiN_x$ film 11a, the $SiO_2$ film 11b, and the a-Si film 12, a plasma chemical vapor deposition (CVD) method, a normal pressure CVD method, a low pressure CVD method, a remote plasma CVD method, and the like are preferable. It is preferable that the $SiN_x$ film 11a, the $SiO_2$ film 11b, and the a-Si film 12 are continuously formed. As a raw material gas for the $SiN_x$ film 11a, a mixed gas of monosilane ($SiH_4$) and ammonia ($NH_3$) and the like may be used. The raw material gas for the $SiO_2$ film 11b is not especially limited. TEOS (tetra ethoxy silane) is preferable. The $SiN_x$ film 11a has a function of preventing impurities such as ions from diffusing from the glass substrate 10, in addition to the function as the hydrogen barrier layer. The $SiO_2$ film 11b has a function as a buffer film. The $SiN_x$ film 11a and the $SiO_2$ film 11b constitute a base insulating film 11. The base insulating film is also called a base coat layer or an undercoat layer, generally.

Then, as shown in FIG. 1-1(b), the a-Si film 12 is irradiated with laser light 1 to be melted and recrystallized. As a result, a polysilicon (p-Si) film is formed. For this crystallization, a Solid Phase Crystallization (SPC) method, and a method in which the SPC method and laser beam irradiation are combined, may be used.

As shown in FIG. 1-1(c), the p-Si film is patterned into each TFT size, thereby forming a p-Si layer 13. It is preferable that the p-Si layer 13 has an island shape. Examples of the shape include a rectangular parallelepiped shape, a truncated pyramid shape such as a truncated quadrangular pyramid, an truncated inverted pyramid shape, a truncated circular cone shape, and an truncated elliptical cone shape. Successively, ultraviolet (UV) cleaning, ozone ($O_3$) cleaning, hydrofluoric acid (HF) cleaning, water cleaning, or alkali cleaning is performed to remove the impurities and the organic film. Then, the surface where the p-Si layer 13 is formed is exposed with hydrogen plasma or hydrogen gas 2.

As shown in FIG. 1-1(d), a $SiO_2$ film 14a with a thickness of 25 nm and a $SiN_x$ film 14b with a thickness of 40 nm are formed. As a method of forming the $SiO_2$ film 14a and the $SiN_x$ film 14b, a plasma chemical vapor deposition (CVD) method, a normal pressure CVD method, a low pressure CVD method, a remote plasma CVD method, and the like are preferable in terms of film thickness controllability and step coverage. It is preferable that the $SiO_2$ film 14a and the $SiN_x$ film 14b are continuously formed. The $SiN_x$ layer 14b constitutes a hydrogen barrier layer. The $SiO_2$ film 14a and the $SiN_x$ film 14b constitute a gate insulating film 14. As a result, according to the present Embodiment, the p-Si layer 13 is sandwiched between the $SiN_x$ film 11a and the $SiN_x$ film 14b, each being the hydrogen barrier layers, and thereby hydrogen is enclosed in the periphery of the p-Si layer 13.

In the present Embodiment, the gate insulating film 14 includes the $SiN_x$ film 14b having a high dielectric constant. Therefore, the equivalent oxide thickness (EOT) can be reduced, which leads to and improvement in TFT performance. It is preferable that the gate insulating film 14 has a multilayer structure including a silicon nitride ($SiN_x$) film as the uppermost layer. According to this structure, impurities such as boron (B), sodium (Na), phosphorus (P), and a heavy metal can be trapped on the surface boundary of the $SiN_x$ film, thereby suppressing the impurities from diffusing into the gate insulating film 14. Therefore, the performances of the TFT can be improved. It is preferable that the gate insulating film 14 has a multilayer structure including a silicon oxide ($SiO_2$) film as the lowest layer. The $SiO_2$ film is excellent in characteristics of the surface boundary with the semiconductor layer including silicon and the like. Therefore, the performances of the TFT can be improved. It is particularly preferable that the gate insulating film 14 has a structure in which a silicon oxide film and a silicon nitride film are stacked on a semiconductor layer in this order, as in the present Embodiment. Further, a structure in which a silicon oxide film, a silicon nitride film, and a silicon oxide film are stacked on the semiconductor layer in this order is preferably adopted as a structure of the gate insulating film 14.

The material for the gate insulating film 14 is not especially limited. The following materials may be used instead of the $SiO_2$ film 14a, for example. SiOF, SiOC, and the like, which are materials having a dielectric constant lower than that of $SiO_2$, titanium dioxide ($TiO_2$), dialuminum trioxide ($Al_2O_3$), tantalum oxide such as ditantalum pentaoxide ($Ta_2O_5$), hafnium dioxide ($HfO_2$), and zirconium dioxide ($ZrO_2$), which are materials having a dielectric constant higher than that of $SiO_2$.

Then, a metal film is deposited by a sputtering method, a CVD method and the like, and then such a metal film is patterned by a photolithography method and the like, thereby forming a gate electrode 15, as shown in FIG. 1-1(e). The $SiN_x$ layer 14b has a high resistance to plasma. Therefore, if the gate insulating film 14 has the $SiN_x$ layer 14b as the uppermost layer, the gate electrode 15 can be formed by dry etching such as plasma etching (plasma ashing) without plasma-damaging the gate insulating film 14. Thus, the reliability of the gate insulating film 14 is secured, and simultaneously, not only the electrode 15 but also the TFT can be finely formed. It is preferable that the gate electrode 15 includes a metal in order to suppress phonon vibration inside the gate insulating film 14. Examples of the material for the gate electrode 15 include metals such as aluminum (Al), tantalum (Ta), tungsten (W), and molybdenum (Mo) and alloys thereof. They may be stacked to be used as the gate electrode 15.

Successively, without removing the photoresist layer after used for patterning the gate electrode 15, impurities 3 are injected into the p-Si layer 13. Phosphorus ions ($P^+$) are injected as the impurities 3 if an N-channel TFT is formed. Boron ions ($B^+$) are injected as the impurities 3 if a P-channel TFT is formed.

Then, annealing is performed to hydrogenate the p-Si layer 13 and activate the impurities 3 injected into the p-Si layer 13. As a result, the p-Si is hydrogenated and a dangling bond can be terminated. A method of heating the entire substrate at 400° C. or less (for example, 300 to 350° C.) for 10 minutes or less is preferable as the annealing method. The measurement results of hydrogen desorption spectrum by TDS (Thermal Desorption Spectroscopy) show that the $SiN_x$ layer 14b might eliminate hydrogen at a temperature higher than the temperature where the $SiN_x$ layer 14b is formed. However, according to the present Embodiment, hydrogen exists around the periphery of the p-Si layer 13, and therefore, hydrogenation can be sufficiently performed by annealing at 400° C. or less that is lower than the temperature where the $SiN_x$ layer 14b is formed for several minutes.

Then, UV cleaning, $O_3$ cleaning, HF cleaning, water cleaning, alkali cleaning, and the like, is performed to remove the impurities and the organic film, and then, by a liquid phase method using a liquid material including polysilazane, an interlayer insulating film 16 that is a polysilazane calcined film is formed, as shown in FIG. 1-2(f). The polysilazane calcined film contains a large amount of moisture, but the reliability of the semiconductor device can be secured because the $SiN_x$ layer 14b is included in the gate insulating film 14. If the interlayer insulating film 16 is formed using a liquid phase method, the liquid material is coated, and then, inevitably subjected to a heating treatment. Therefore, the above-mentioned annealing for the p-Si layer 13 is omitted, and under the same conditions as in the annealing, the heating treatment may be performed after the liquid material is coated. As the interlayer insulating film 16, a $SiN_x$ film, a $SiO_2$ film, and the like may be formed by a plasma CVD method and the like without using the liquid phase method.

Then, contact etching is performed. Specifically, the part on the $SiN_x$ film 14b is dry-etched, and then, the part on the p-Si layer 13 is wet-etched, thereby forming a contact hole 17. In this case, the $SiN_x$ film 14b has a high resistance to plasma, which can suppress the $SiO_2$ film 14a and the like from being damaged by the dry etching.

Finally, a source electrode 18 is formed, and as a result, a TFT is completed, as shown in FIG. 1-2(g). According to the present Embodiment, the hydrogenation can be sufficiently performed by annealing at 400° C. or less for several minutes. Therefore, a high-performance TFT can be produced by a low-temperature process.

According to the present Embodiment, the production step of the TFT having a top gate structure is shown in FIG. 1-2(g). However, the order of the steps and the like is slightly changed, thereby producing a TFT having a dual-gate structure as shown in FIG. 2 and a TFT having a bottom-gate structure as shown in FIG. 3.

Embodiment 2

In the present Embodiment, a TFT having an embodiment in which a semiconductor layer is surrounded by hydrogen barrier layers of the first and second insulating films is mentioned. The same content as in Embodiment 1 is partly omitted.

FIGS. 4-1(a) to 4-1(e) and 4-2(f) to 4-2(h) are cross sectional views schematically showing production steps of a semiconductor device (TFT) according to Embodiment 2.

In the present Embodiment, as shown in FIG. 4-1(a), a silicon nitride ($SiN_x$) film 41a with a thickness of 50 nm, a silicon oxide ($SiO_2$) film 41b with a thickness of 100 nm, and an amorphous silicon (a-Si) film 42 with a thickness of 50 nm are successively formed on a glass substrate 40, first. The $SiN_x$ film 41a has a function of preventing impurities such as ions and the like from diffusing from the glass substrate 40, in addition to the function as the hydrogen barrier layer. The $SiO_2$ film 41b has a function as a buffer film. The $SiN_x$ film 41a and the $SiO_2$ film 41b constitute a base insulating film 41.

Then, as shown in FIG. 4-1(b), the a-Si film 42 is irradiated with laser light 1 to be melted and recrystallized. As a result, a polysilicon (p-Si) film is formed.

Then, as shown in FIG. 4-1(c), the p-Si film is patterned into each TFT size, thereby forming a p-Si layer 43. Successively, ultraviolet (UV) cleaning, ozone ($O_3$) cleaning, hydrofluoric acid (HF) cleaning, water cleaning, alkali cleaning, and the like, is performed to remove the impurities and the organic film. Then, the surface where the p-Si layer 43 is formed is exposed with hydrogen plasma or hydrogen gas 2.

Then, as shown in FIG. 4-1(d), a $SiO_2$ film 44a with a thickness of 20 nm and a $SiN_x$ film 44b with a thickness of 40 nm are formed. The $SiN_x$ film 44b constitutes a hydrogen barrier layer. The $SiO_2$ film 44a and the $SiN_x$ film 44b constitute a gate insulating film 44.

In the present Embodiment, the gate insulating film 44 has a $SiN_x$ film 44b having a large dielectric constant. Therefore, the equivalent oxide thickness (EOT) can be reduced, which leads to an improvement in TFT performance. It is preferable that the gate insulating film 44 has a multilayer structure including a silicon nitride ($SiN_x$) film as the uppermost layer. According to this structure, impurities such as boron (B), sodium (Na), phosphorus (P), and a heavy metal can be trapped on the surface boundary of the $SiN_x$ film, thereby suppressing the impurities from diffusing into the gate insulating film 44. Therefore, the performances of the TFT can be improved. It is preferable that the gate insulating film 44 has a multilayer structure including a silicon oxide ($SiO_2$) film as the lowest layer. The $SiO_2$ film is excellent in characteristics of the surface boundary with the semiconductor layer including silicon and the like. Therefore, the performances of the TFT can be improved. It is particularly preferable that the gate insulating film 44 has a structure in which a silicon oxide film and a silicon nitride film are stacked on the semiconductor layer in this order, as in the present Embodiment.

Then, as shown in FIG. 4-1(e), the $SiO_2$ film 41b, the $SiO_2$ film 44a, and the $SiN_x$ film 44b, other than those near the p-Si layer 43, are removed by patterning, for example, using a photolithography method such as dry etching.

Then, a metal film is deposited by a sputtering method, a CVD method and the like, and then such a metal film is patterned by a photolithography method and the like, thereby forming a gate electrode 45 as shown in FIG. 4-2(f). The $SiN_x$ layer 44b has a high resistance to plasma. Therefore, if the gate insulating film 44 has the $SiN_x$ layer 44b as the uppermost layer, the gate electrode 45 can be formed by dry etching such as plasma etching (plasma ashing) without plasma-damaging the gate insulating film 44. Thus, the reliability of the gate insulating film 44 is secured, and simultaneously, not only the electrode 45 but also the TFT can be finely formed.

Successively, without removing the photoresist layer after used for patterning the gate electrode 45, impurities 3 are injected into the p-Si layer 43. Phosphorus ions ($P^+$) are injected as the impurities 3 if an N-channel TFT is formed. Boron ions ($B^+$) are injected as the impurities 3 if a P-channel TFT is formed.

Then, as shown in FIG. 4-2(g), a $SiN_x$ film 49 with a thickness of 50 nm is formed to cover the glass substrate other than that near the p-Si layer 43, the $SiN_x$ layer 44b near the p-Si layer 43, and the gate electrode 45 on the $SiN_x$ layer 44b. The $SiN_x$ film 49 has a function as the hydrogen barrier layer. As a result, according to the present Embodiment, the p-Si layer 43 is surrounded by three hydrogen barrier layers, i.e., the $SiN_x$ films 41a, 44b, and 49, and thereby the hydrogen is enclosed around the periphery of the p-Si layer 43.

Then, annealing is performed to hydrogenate the p-Si layer 43 and activate the impurities 3 injected into the p-Si layer 43. As a result, the p-Si is hydrogenated and a dangling bond can be terminated. A method of heating the entire substrate at 400° C. or less (for example, 300 to 350° C.) for 10 minutes or less is preferable as the annealing method. The measurement results of hydrogen desorption spectrum by TDS (Thermal Desorption Spectroscopy) show that the $SiN_x$ layers 44b and 49 might eliminate hydrogen at a temperature higher than the temperature where the $SiN_x$ layers 44b and 49 are formed. However, according to the present Embodiment, hydrogen exists around the periphery of the p-Si layer 43, and therefore, hydrogenation can be sufficiently performed by annealing at 400° C. or less that is lower than the temperature where the $SiN_x$ layers 44b and 49 are formed for several minutes.

Then, UV cleaning, $O_3$ cleaning, HF cleaning, water cleaning, alkali cleaning, and the like, is performed to remove the impurities and the organic film, and then, by a liquid phase method using a liquid material including polysilazane, an interlayer insulating film 46 that is a polysilazane calcined film is formed, as shown in FIG. 4-2(h). The polysilazane calcined film contains a large amount of moisture, but the reliability of the semiconductor device can be secured because the $SiN_x$ layer 44b is included in the gate insulating film 44.

Then, contact etching is performed. Specifically, the part on the $SiN_x$ film 44b is dry-etched, and then, the part on the p-Si layer 43 is wet-etched, thereby forming a contact hole 47.

In this case, the SiN$_x$ film 44b has a high resistance to plasma, which can suppress the SiO$_2$ film 44a and the like from being damaged by the dry etching.

Finally, a source electrode 48 is formed, and as a result, a TFT is completed. According to the present Embodiment, the hydrogenation can be sufficiently performed by annealing at 400° C. or less for several minutes. Therefore, a high-performance TFT can be produced by a low-temperature process.

Verification Test of SiN$_x$ Film's Hydrogen-Enclosing Effect

For determining the SiN$_x$ film's hydrogen-enclosing effect, three N-channel TFTs having different structures shown in FIGS. 5(a) to 5(c) were prepared to be measured for a change in mobility when the arrangement of the SiN$_x$ film was different. The TFT shown in FIG. 5(a) had a structure in which a SiN$_x$ film 51a was arranged only on a lower side of a p-Si layer 53. The TFT shown in FIG. 5(b) had a structure in which a SiN$_x$ film 64b was arranged only on an upper side of a p-Si layer 63. The TFT shown in FIG. 5(c) had a structure in which a SiN$_x$ film 71a was arranged on a lower side of a p-Si layer 73 and a SiN$_x$ film 74b was arranged on an upper side of the p-Si layer 73.

The TFT was prepared under the same conditions as in Embodiment 1, except that the hydrogenation temperature was 350° C. and the temperature where the gate insulating film was prepared by a plasma CVD method was 400° C.

The measurement results of the mobility show that the TFT shown in FIG. 5(a) had a mobility of 75 cm$^2$/Vs; the TFT shown in FIG. 5(b) had a mobility of 100 cm$^2$/Vs; and the TFT shown in FIG. 5(c) had a mobility of 175 cm$^2$/Vs. Thus, it was determined that if the SiN$_x$ film that is the hydrogen barrier layer was arranged on a lower side and an upper side of the p-Si layer, the mobility of the N-channel TFT could be improved.

In addition, in the TFT shown in FIG. 5(c), a change in a mobility of an N-channel TFT was measured when the thickness of the SiO$_2$ film 74a was 50 nm; the distance between the p-Si layer 73 and the SiN$_x$ film 74b (with a thickness of 40 nm) formed on an upper side of the p-Si layer 73 was fixed to 50 nm; and the distance between the p-Si layer 73 and the SiN$_x$ film 71b (the thickness of the SiO$_2$ film 71b) formed on a lower side of the p-Si layer 73 was changed to 50 nm, 100 nm, and 200 nm. The results show that in the N-channel TFT, the mobility was reduced when the distance between the p-Si layer and the SiN$_x$ film formed on a lower side of the p-Si layer was 200 nm in comparison to the case where the distance was 50 nm or 100 nm.

The present application claims priority under the Paris Convention and the domestic law in the country to be entered into national phase on Patent Application No. 2006-016782 filed in Japan on Jan. 25, 2006, the entire contents of which are hereby incorporated by reference.

The terms "or more" and "or less" mean that the described value is included. That is, the term "or more" means that the described value and values higher than the described value are included.

BRIEF DESCRIPTION OF DRAWINGS

FIGS. 1-1(a) to 1-1(e) are cross-sectional views schematically showing the first half of the production steps of the TFT according to Embodiment 1.

[FIG. 1-2]
FIGS. 1-2(f) to 1-2(g) are cross-sectional views schematically showing the last half of the production steps of the TFT according to Embodiment 1.

FIG. [2]
FIG. 2 is a cross-sectional view schematically showing a TFT having a dual-gate structure according to the present invention.

FIG. [3]
FIG. 3 is a cross-sectional view schematically showing a TFT having a bottom-gate structure according to the present invention.

FIG. [4-1]
FIGS. 4-1(a) to 4-1(e) are cross-sectional views schematically showing the first half of the production steps of the TFT according to Embodiment 2.

FIG. [4-2]
FIGS. 4-2(f) to 4-2(h) are cross-sectional views schematically showing the last half of the production steps of the TFT according to Embodiment 2.

FIG. [5]
FIG. 5(a) shows an embodiment in which the SiN$_x$ film is formed only on a lower side of the p-Si layer.
FIG. 5(b) shows an embodiment in which the SiN$_x$ film is formed only on an upper side of the p-Si layer.
FIG. 5(c) shows an embodiment in which the SiN$_x$ film is formed on a lower side of the p-Si layer and the SiN$_x$ film is also formed on an upper side of the p-Si layer.

EXPLANATION OF NUMERALS AND SYMBOLS

Figure 1:
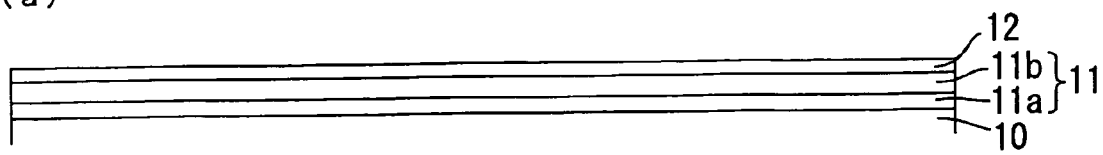
[FIG. 1-1]
Figure 1:
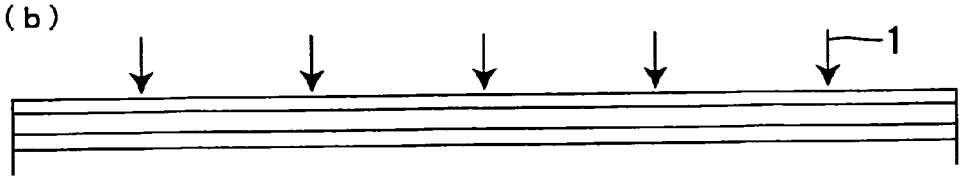
Figure 1:
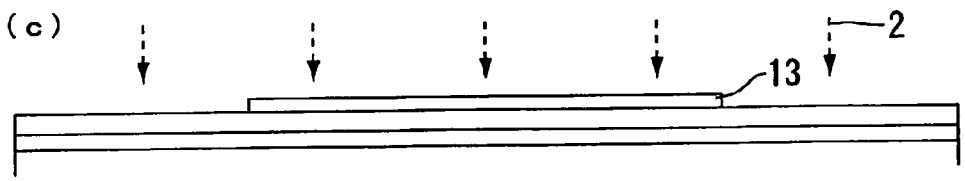
Figure 1:
Figure 1:
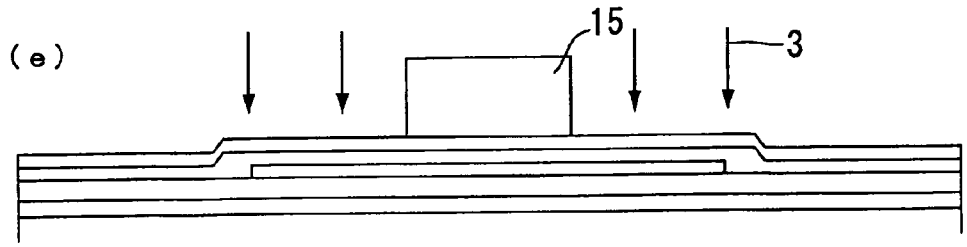
Figures 2, 4:
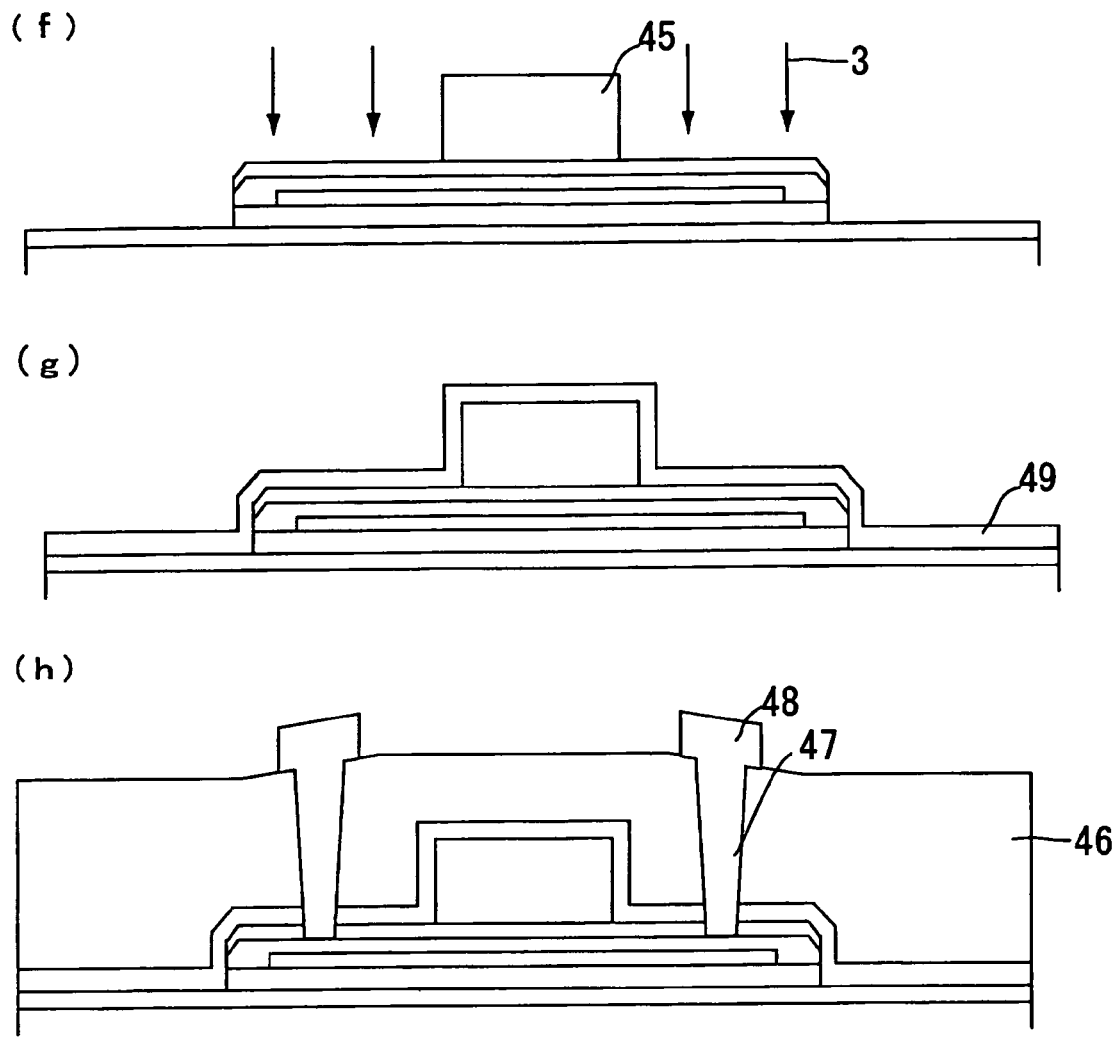
Figure 5:
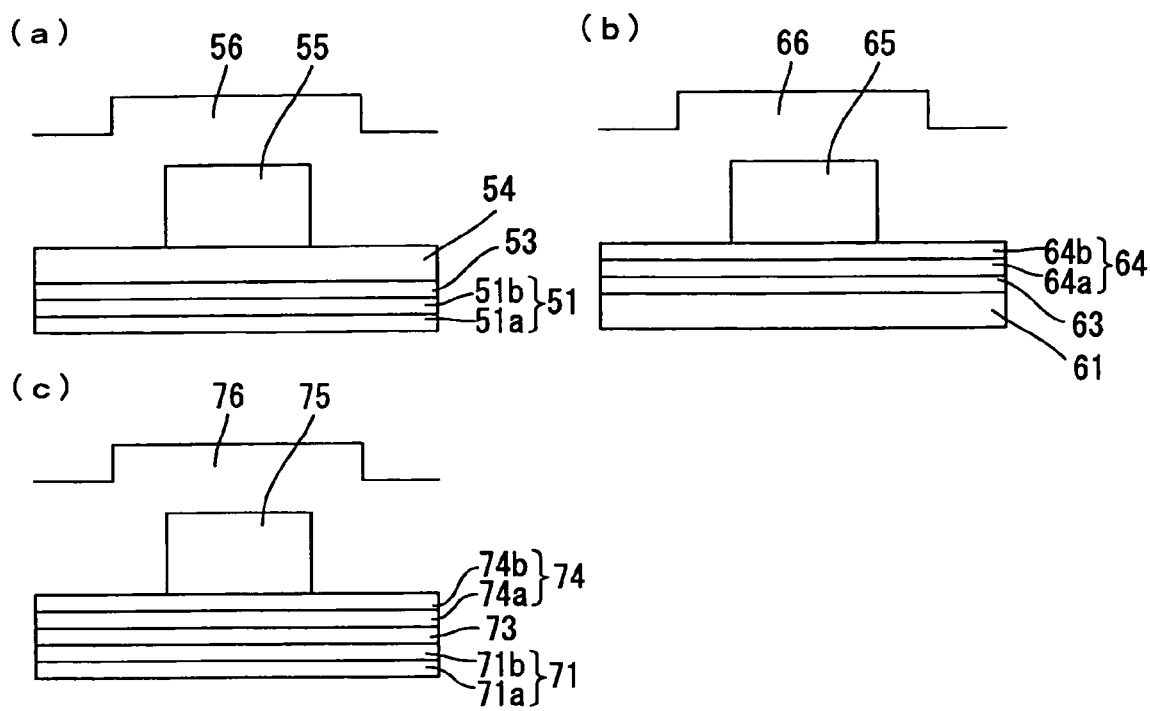
FIG. 5 is a cross-sectional view schematically showing the N-channel TFT prepared in the verification test of SiN$_x$ film's hydrogen-enclosing effect.

1: Laser light
2: Hydrogen plasma or hydrogen gas
3: Impurity
10, 40: Glass substrate
11, 41, 51, 61, 71: Base insulating film
11a, 21a, 31a, 41a, 51a, 71a: SiN$_x$ film
11b, 21b, 31b, 41b, 51b, 71b: SiO$_2$ film
12, 42: Amorphous silicon film
13, 23, 33, 43, 53, 63, 73: Polysilicon layer
14, 21, 24, 31, 41, 44, 54, 64, 74: Gate insulating film
14a, 24a, 34a, 44a, 64a, 74a: SiO$_2$ film
14b, 24b, 34b, 44b, 49, 64b, 74b: SiN$_x$ film
15, 25a, 25b, 35, 45, 55, 65, 75: Gate electrode
16, 26, 34, 36, 46, 56, 66, 76: Interlayer insulating film
17, 47: Contact hole
18, 48: Source electrode

The invention claimed is:

1. A production method of a semiconductor device including a first insulating film, a semiconductor layer, and a second insulating film in this order on a substrate,
the method comprising the steps of:
forming a first insulating film including a hydrogen barrier layer;
forming a semiconductor layer on a region where the hydrogen barrier layer of the first insulating film is formed;
injecting hydrogen into the semiconductor layer;
forming a second insulating film, the second insulating film including a hydrogen barrier layer on at least a region where the semiconductor layer is formed; and
subjecting the semiconductor layer to hydrogenation annealing.

2. The production method according to claim 1,
wherein the semiconductor device includes a gate electrode on an upper side of the second insulating film.

3. The production method according to claim 1,
wherein the semiconductor device includes a gate electrode on a lower side of the first insulating film.

4. The production method according to claim 1,
wherein the semiconductor device includes a gate electrode on a lower side of the first insulating film and a gate electrode on an upper side of the second insulating film.

5. The production method according to claim 1,
wherein the hydrogenation annealing for the semiconductor layer is performed at 400° C. or less.

6. The production method according to claim 1,
wherein the substrate has a thermal deformation temperature of 400° C. or less.

7. The production method according to claim 2,
wherein the gate electrode has a thermal deformation temperature of 400° C. or less.

8. The production method according to claim 1,
wherein the semiconductor layer is surrounded by the hydrogen barrier layers.

9. The production method according to claim 1,
wherein the hydrogen barrier layer of the first insulating film and the semiconductor layer are formed to have a distance of less than 200 nm therebetween, and
the hydrogen barrier layer of the second insulating film and the semiconductor layer are formed to have a distance of less than 200 nm therebetween.

10. The production method according to claim 1,
wherein the hydrogen barrier layer of the first insulating film and the hydrogen barrier layer of the second insulating film are silicon nitride films.

11. The production method according to claim 1,
wherein a silicon nitride film is formed on an upper side of the semiconductor layer,
a silicon nitride film is also formed on a lower side of the semiconductor layer, and
each of the silicon nitride films formed on an upper side and a lower side of the semiconductor layer has a thickness of 20 nm or more on a region other than a region where an electrode is formed.

12. The production method according to claim 1,
wherein the hydrogen barrier layer of the second insulating film serves as a moisture barrier layer.

13. The production method according to claim 12,
wherein the semiconductor device further includes an interlayer insulating film on the second insulating film, and
the production method includes a step of forming the interlayer insulating film using a liquid material.

14. A semiconductor device produced by the production method of claim 1.

15. A semiconductor device comprising a first insulating film, a semiconductor layer, and a second insulating film in this order on a substrate,
wherein each of the first and second insulating films includes a hydrogen barrier layer on at least a region where the semiconductor layer is formed,
the hydrogen barrier layer of the first insulating film and the semiconductor layer are formed to have a distance of 200 nm therebetween, and
the hydrogen barrier layer of the second insulating film and the semiconductor layer are formed to have a distance of 200 nm therebetween.

16. A semiconductor device comprising a first insulating film, a semiconductor layer, and a second insulating film in this order on a substrate,
wherein each of the first and second insulating films includes a hydrogen barrier layer, and
the semiconductor layer is surrounded by the hydrogen barrier layers.

17. The semiconductor device according to claim 15,
wherein the semiconductor device includes a gate electrode on an upper side of the second insulating film.

18. The semiconductor device according to claim 15,
wherein the semiconductor device includes a gate electrode on a lower side of the first insulating film.

19. The semiconductor device according to claim 15,
wherein the semiconductor device includes a gate electrode on a lower side of the first insulating film and a gate electrode on an upper side of the second insulating film.

20. The semiconductor device according to claim 15,
wherein the substrate has a thermal deformation temperature of 400° C. or less.

21. The semiconductor device according to claim 17,
wherein the gate electrode has a thermal deformation temperature of 400° C. or less.

22. The semiconductor device according to claim 15,
wherein the hydrogen barrier layer of the first insulating film and the hydrogen barrier layer of the second insulating film are silicon nitride films.

23. The semiconductor device according to claim 15,
wherein a silicon nitride film is formed on an upper side of the semiconductor layer,
a silicon nitride film is also formed on a lower side of the semiconductor layer, and
each of the silicon nitride films formed on an upper and a lower side of the semiconductor layer has a thickness of 20 nm or more on a region other than a region where an electrode is formed.

24. The semiconductor device according to claim 15,
wherein the hydrogen barrier layer of the second insulating film serves as a moisture barrier layer.

25. The semiconductor device according to claim 15,
wherein the semiconductor device further includes an interlayer insulating film formed using a liquid material on the second insulating film.

26. A display device comprising the semiconductor device of claim 14.

* * * * *